United States Patent
Bretschneider

(10) Patent No.: US 6,751,079 B2
(45) Date of Patent: Jun. 15, 2004

(54) CIRCUIT FOR THE DETECTION OF SHORT VOLTAGE GLITCHES IN A SUPPLY VOLTAGE

(75) Inventor: Ernst Bretschneider, Erfurt (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 63 days.

(21) Appl. No.: 10/128,816

(22) Filed: Apr. 24, 2002

(65) Prior Publication Data

US 2002/0186038 A1 Dec. 12, 2002

(30) Foreign Application Priority Data

Apr. 25, 2001 (DE) .......................... 101 20 147

(51) Int. Cl.[7] ............................... H02H 3/08
(52) U.S. Cl. ......................... 361/90; 361/93.1
(58) Field of Search ............... 361/90, 93.1, 93.4, 361/93.5, 93.6, 93.7, 93.9, 100, 111, 115

(56) References Cited

U.S. PATENT DOCUMENTS

| | | | |
|---|---|---|---|
| 6,085,342 A | * | 7/2000 | Marholev et al. ........... 714/724 |
| 6,265,921 B1 | * | 7/2001 | Heinrich ..................... 327/170 |
| 6,362,632 B1 | * | 3/2002 | Livingston .................. 324/661 |
| 6,410,998 B1 | * | 6/2002 | Rall ........................... 307/130 |
| 6,411,482 B1 | * | 6/2002 | Funke ........................ 361/91.1 |
| 6,424,513 B1 | * | 7/2002 | Wissell et al. ............. 361/93.1 |

* cited by examiner

*Primary Examiner*—Brian Sircus
*Assistant Examiner*—Danny Nguyen
(74) *Attorney, Agent, or Firm*—Kevin Simons

(57) ABSTRACT

The invention relates to a circuit for the detection of short voltage glitches in a supply voltage Vsup (glitch detector). According to the circuit the two inputs (VN, VP) of a comparator (C) are connected to a voltage divider (R1, R2, R3). In case of a short voltage glitch the connection of the first input (VN) of the comparator (C) to the voltage divider is interrupted via a first transistor (N1), so that this input is fixed at the previous voltage level, while the other input (VP) changes in accordance with the voltage glitch. If the change is strong enough, there is a polarity reversal at the input of the comparator (C) and thus a flipping of the output signal (OUT) which shows the detection of a voltage glitch.

3 Claims, 1 Drawing Sheet

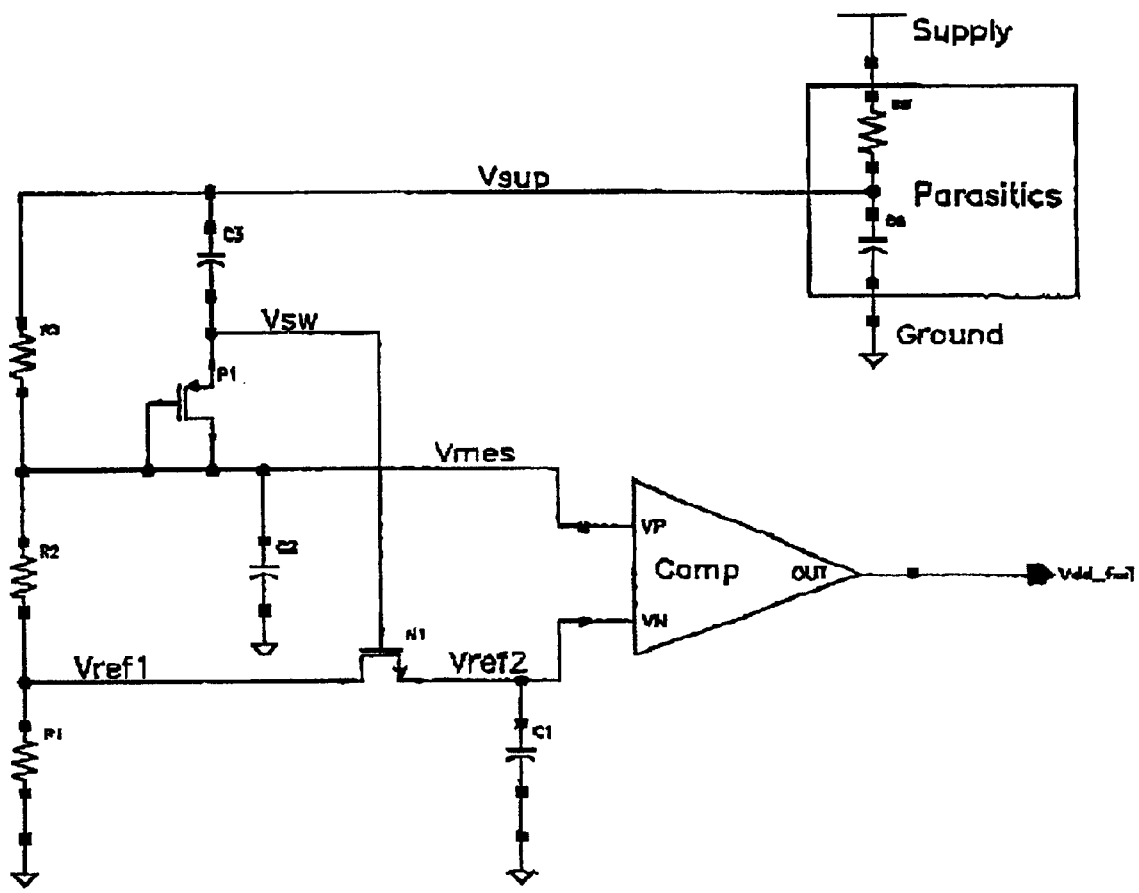

CIRCUIT FOR THE DETECTION OF SHORT VOLTAGE GLITCHES IN A SUPPLY VOLTAGE

FIELD OF THE INVENTION

The invention relates to a circuit for the detection of short voltage glitches in a supply voltage, comprising a comparator with a first input and a second input and an output for indicating a detected voltage glitch.

BACKGROUND OF THE INVENTION

A circuit arrangement of the type defined in the opening paragraph is known from WO 98/50859. Said circuit is an integrated part of a so-termed power-on reset circuit which is used for bringing the elements of an associated integrated microelectronic circuit to a defined output state after a supply voltage has been switched on. The conventional power-on reset circuit generally works as an integrated circuit and therefore always needs to have an adequate time space for registration of a fluctuation of the supply voltage. Therefore, very short (typically shorter than 1 $\mu$s) and deep power supply glitches which are referred to as so-termed glitch pulses pass unnoticed by unbuffered operating circuits. These glitch pulses are very hard to detect, but may disturb the behavior of the circuit and may even cause malfunctioning. According to WO 98/50859 a known power-on reset circuit is extended by a glitch detector which is particularly tuned to detecting short voltage glitches so that, subsequently, the circuit can be reset reliably.

The basic principle used in said glitch detector comprises the calculated discharge of a capacitor in case of a voltage glitch in the supply voltage and the evaluation of the subsequent charging curve of the capacitor by means a comparator. The glitch detector then needs to have a reference voltage for the negative comparator input and an additional reference voltage for the gate of a transistor. Such reference voltages, however, are not available at any rate when the supply voltage is turned on, which restricts the use of the circuit. In addition, the known circuit of the glitch detector strongly depends on the threshold voltages of the transistors used.

SUMMARY OF THE INVENTION

Against this background it is an object of the present invention to provide a circuit for the detection of short voltage glitches in a supply voltage, which circuit has a wider range of application and a higher function reliability.

This object is achieved by means of a circuit having the characteristic features of claim 1. Advantageous embodiments are contained in the dependent claims.

Accordingly, the circuit comprises:
a) a comparator having a first input and a second input as well as an output for indicating a detected voltage glitch;
b) a voltage divider connected between the supply voltage and ground, from which voltage divider the first input of the comparator taps a first and the second input of the comparator taps a second voltage;
c) a first capacitor which is connected between the first input of the comparator and ground;
d) an interrupter circuit which interrupts the connection between the first input of the comparator and the voltage divider if there is a voltage glitch in the supply voltage. The two inputs of the comparator are supplied with two different voltages by the circuit described when the supply voltage is turned on, the magnitude of which different voltages can be freely adjusted by means of the taps from the voltage divider. One of the two voltages (preferably the one closer to the ground potential) is additionally imposed on the first capacitor when there is a steady voltage. In case of a voltage glitch the connection between the first input of the comparator and the voltage divider is then interrupted, so that the first input is still connected only to the first capacitor and is thus kept at the previous voltage level that is stored in the capacitor. The other input of the comparator, on the other hand, is unchanged connected to the voltage divider, so that it proportionally follows the voltage glitch. If the voltage glitch is deep enough then, there is a state of the variable potential at the second input of the comparator beyond the voltage of the invariable first input coming closer to the ground potential. Therefore, there is a reversal of polarities at the inputs of the comparator, after which a corresponding signal is generated at the comparator output. This signal then indicates the detection of a voltage glitch.

The circuit according to the invention makes it possible by varying the taps from the voltage divider to change the level of the voltage glitch to be detected and thus flexibly adjust the circuit to the respective needs. In addition, no reference voltages are needed at the comparator inputs.

According to a further embodiment of the interrupter circuit it comprises a first transistor whose source-drain path is situated in the connection line between the first input of the comparator and the voltage divider, and whose gate is controlled by a voltage which, proportionally to the voltage glitch, comes closer to the ground potential if there is a voltage glitch. The transistor which is connected in forward direction if the supply voltage is undisturbed is then cut-off and separates the first comparator input from the voltage divider, so that the input is uncoupled from the voltage glitch.

Preferably the interrupter circuit additionally comprises the following elements:
e) a second capacitor which is connected between ground and the second input of the comparator;
f) a third capacitor, one terminal of which is connected to the supply voltage;
g) a second transistor whose source is connected to the second terminal of the above-mentioned third capacitor and whose drain and gate are connected to the second input of the comparator;
h) a connection line from the source of the second transistor to the gate of the first transistor.

An interrupter circuit comprising the above components is capable of generating a cut-off voltage at the gate of the first transistor, which cut-off voltage is proportional to the voltage glitch of the supply voltage. The threshold voltage of the transistors plays a very subordinate role for the reliable functioning of the whole circuit because the transistors operate as switches and do not serve to detect a voltage level.

SHORT DESCRIPTION OF THE DRAWINGS

In the following the invention will be further explained with reference to the FIGURE. The sole FIGURE shows a connection diagram of a detection circuit according to the invention for the detection of short voltage glitches in a supply voltage Vsup.

BEST WAY TO EMBODY THE INVENTION

The supply voltage Vsup originates from a circuit block not of further interest here in which the parasitic elements of the circuit are combined by a resistor R0 and a capacitor C0. The latter components deform voltage glitches that are clearly shorter than 50 ns, usually so that their glitch length is clearly reduced and they thus remain unharmful for the circuit.

This voltage Vsup is connected to ground via the three resistors R1, R2 and R3 connected in series. To the ground side of the middle resistor R2 is connected the negative terminal VN and to the opposite side the positive terminal VP of a comparator C. The connection of the negative input VN then runs via the source-drain path of a transistor N1 operating as a switch. The comparator C with the negative input VN taps the voltage Vref1 between the resistors R1 and R2 and with the positive input VP the voltage Vmes between the resistors R2 and R3. In normal condition, that is to say, with a substantially constant supply voltage Vsup, Vmes>Vref1 and the output OUT of the comparator C is stable at a first level.

Between the negative input VN of the comparator C and ground is connected a first capacitor C1 and between the positive input VP of the comparator C and ground is connected a second capacitor C2. Furthermore, a third capacitor C3 is connected in series with the source-drain path of a second transistor P1 between the supply voltage Vsup and the positive input VP of the comparator C. The gate of this second transistor P1 is also connected to the voltage Vmes of the positive input VP of the comparator C.

Furthermore, the gate of the first transistor N1 in the line between the input VN of the comparator C and the voltage divider is supplied with the potential Vsw which is present in the line between the third capacitor C3 and the source of the second transistor P1.

If there is a sufficiently deep voltage glitch in the supply voltage Vsup, the second transistor P1 together with the third capacitor C3 generate a cut-off voltage influencing the gate of the transistor N1 operating as a switch, so that the current path from the voltage divider to the negative input VN of the comparator C1, that is the path between Vref1 and Vref2, is interrupted for the duration of the glitch pulse, so that the capacitor C1 cannot be discharged. The voltage Vref2 on the negative input VN of the capacitor C thus sticks to its previous value. The voltage Vmes of the second capacitor C2, on the other hand, drops due to the discharge via the resistors R2 and R1 in proportion to the depth of the glitch. When the circuit is dimensioned accordingly, it distinguishes the voltage Vref2, so that the polarity on the input of the comparator is reversed. If, after a short glitch, the supply voltage Vsup increases again, Vmes will slowly follow this effect in accordance with the charging curve of the second capacitor C2. Then the voltage value Vdd_fail on the output OUT of the comparator C flips to its opposite level for the period of time in which Vmes is smaller than Vref2.

The output signal of the comparator C can thus be used for generating a digital error message. When the circuit is used with the aid of the voltage divider, two voltage points in the linear gain range of the operational amplifier C may be chosen whose difference Vmes −Vref1 is proportional to the maximum permitted voltage glitch in the supply voltage. With the circuit shown the voltage glitches can thus be detected in the range from below the noise level of the supplier to the ground potential level.

LIST OF REFERENCE CHARACTERS

| | |
|---|---|
| Vsup | supply voltage |
| R0, R1, R2, R3 | resistors |
| C0, C1, C2, C3 | capacitors |
| N1, P1 | transistors |
| VP | positive input |
| VN | negative input |
| C | comparator |
| OUT | output |
| Vmes, Vsw, Vref1 Vref2, Vdd_fail | voltages |

What is claimed is:

1. A circuit for the detection of short voltage glitches in a supply voltage (Vsup), comprising
   a) a comparator (C) having a first input (VN) and a second input (VP) as well as an output (OUT) for indicating a detected voltage glitch;
   b) a voltage divider (R1, R2, R3) connected between the supply voltage (Vsup) and ground, from which voltage divider (R1, R2, R3) the first input (VN) of the comparator (C) taps a first (Vref1) and the second input (VP) of the comparator (C) taps a second voltage (Vmes);
   c) a first capacitor (C1) which is connected between the first input (VN) of the comparator (C) and ground;
   d) an interrupter circuit (N1, C3, P1, C2) which interrupts the connection between the first input (VN) of the comparator (C) and the voltage divider if there is a voltage glitch in the supply voltage.

2. A circuit as claimed in claim 1, characterized in that the interrupter circuit comprises a first transistor (N1) whose source-drain path is situated in the connection line between the first input (VN) of the comparator (C) and the voltage divider, and whose gate is controlled by a voltage (Vsw) coming closer to the ground potential if there is a voltage glitch.

3. A circuit as claimed in claim 2, characterized in that the interrupter circuit furthermore comprises:
   e) a second capacitor (C2) which is connected between ground and the second input (VP) of the comparator (C);
   f) a third capacitor (C3), one terminal of which is connected to the supply voltage (Vsup);
   g) a second transistor (P1) whose source is connected to the second terminal of the third capacitor (C3) and whose drain and gate are connected to the second input (VP) of the comparator (C);
   h) a connection line from the source of the second transistor to the gate of the first transistor.

* * * * *